United States Patent
Mitchell

(10) Patent No.: US 6,740,894 B1
(45) Date of Patent: May 25, 2004

(54) ADJUSTABLE IMPLANTATION ANGLE WORKPIECE SUPPORT STRUCTURE FOR AN ION BEAM IMPLANTER UTILIZING A LINEAR SCAN MOTOR

(75) Inventor: Robert J. Mitchell, Winchester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/371,606

(22) Filed: Feb. 21, 2003

(51) Int. Cl.[7] .......................... H01J 37/317; H01J 37/20
(52) U.S. Cl. .............................. 250/492.21; 250/492.2; 250/491.1; 250/492.3; 250/398; 250/400; 250/440.11; 250/442.11
(58) Field of Search .................. 250/492.21, 492.2, 250/491.1, 492.3, 398, 400, 440.11, 442.11

(56) References Cited

U.S. PATENT DOCUMENTS

| | | |
|---|---|---|
| 4,293,137 A | 10/1981 | Ezekiel |
| 4,761,559 A | 8/1988 | Myron |
| 4,975,586 A | 12/1990 | Ray et al. |
| 5,229,615 A | 7/1993 | Brune et al. |
| 5,436,790 A | 7/1995 | Blake et al. |
| 5,444,597 A | 8/1995 | Blake et al. |
| 6,163,033 A | 12/2000 | Smick et al. |
| 6,207,959 B1 | 3/2001 | Satoh et al. |
| 6,222,196 B1 * | 4/2001 | Mack ................... 250/492.21 |
| 6,437,351 B1 * | 8/2002 | Smick et al. .......... 250/492.21 |

OTHER PUBLICATIONS

Eleven Pages Downloaded from Ferro-Tec (USA) Corporation, Nashua, NH, Website (domain name: www.ferrotec.com), describing FerroFluidic Seals, copyright 2001–2003.

* cited by examiner

Primary Examiner—Nikita Wells
(74) Attorney, Agent, or Firm—Watts, Hoffmann Co., LPA

(57) ABSTRACT

An ion beam implanter includes an ion beam source for generating an ion beam moving along a beam line and a vacuum or implantation chamber wherein a workpiece is positioned to intersect the ion beam for ion implantation of a surface of the workpiece by the ion beam. The ion beam implanter further includes a workpiece support structure coupled to the implantation chamber and supporting the workpiece. The workpiece support structure includes a rotation member rotatably affixed to the implantation chamber. Rotation of the rotation member with respect to the implantation chamber changes an implantation angle of the workpiece with respect to the portion of the ion beam beam line within the implantation chamber. The workpiece support structure further includes a translation member disposed within the implantation chamber, movably coupled to the rotation member and supporting the workpiece for linear movement along a path of travel. The translation member includes a linear motor.

34 Claims, 4 Drawing Sheets

ADJUSTABLE IMPLANTATION ANGLE WORKPIECE SUPPORT STRUCTURE FOR AN ION BEAM IMPLANTER UTILIZING A LINEAR SCAN MOTOR

FIELD OF THE INVENTION

The present invention relates to an adjustable implantation angle workpiece support assembly or structure coupled to an implantation chamber of an ion beam implanter and, more particularly, to a workpiece support assembly or structure that provides for rotational and linear movement of a workpiece with respect to an ion beam such that an implantation angle of the workpiece may be selected and the workpiece translated along a linear path at the selected implantation angle wherein a distance from an ion beam entrance to the implantation chamber to the intersection of the ion beam and an implantation surface of the workpiece remains constant during translation of the workpiece.

BACKGROUND ART

Ion beam implanters are widely used in the process of doping semiconductor wafers. An ion beam implanter generates an ion beam comprised of desired species of positively charged ions. The ion beam impinges upon an exposed surface of a workpiece such as a semiconductor wafer, substrate or flat panel, thereby "doping" or implanting the workpiece surface with desired ions. Some ion implanters utilize serial implantation wherein a single, relatively large wafer workpiece is positioned on a support in an implantation chamber and implanted. The implantation occurs one workpiece at a time. The support is oriented such that the workpiece is in the ion beam beam line and the ion beam is repetitively scanned over the workpiece to implant a desired dosage of ions. When the implantation is complete, the workpiece is removed from the support and another workpiece is positioned on the support for implantation.

In recent years, the trend in the semiconductor industry has been to use increasingly larger wafer workpieces, for example, 300 mm. diameter wafers. The ability to implant large wafer workpieces or other workpieces such as flat panels has become very desirable. One way to implant a workpiece serially is to move it in front of a scanned, fanned or ribbon ion beam. Such an ion beam is wide enough so that the entire width of the workpiece can be implanted uniformly. In order to implant the entire workpiece, a second motion transverse to a direction or extent of the ion beam is required. Further, it is often desired to be able to change an angle of implantation for a particular workpiece being implanted. The angle of implantation is the angle of incidence formed between the ion beam and the treatment surface of the workpiece. An implantation angle of 0 degrees means that an implantation surface of the workpiece is normal to the ion beam beam line.

One shortcoming of workpiece support structures of prior art ion beam implanters is that, other than an implantation angle of 0 degrees, movement of the workpiece along a path of travel perpendicular to the ion beam beam line causes a distance that the beam travels within the implantation chamber before striking the workpiece implantation surface to change. Stated another way, if the implantation angle is not 0 degrees, the workpiece can be viewed as being tilted with respect to the ion beam beam line. If such a tilted workpiece is moved perpendicularly with respect to the ion beam beam line, when portions of the workpiece tilted toward the ion beam are being implanted, a distance that the ion beam travels in the implantation chamber before striking the implantation surface will be reduced compared to the beam distance at a center of the workpiece implantation surface. On the other hand, when portions of the workpiece tilted away from the ion beam are being implanted, a distance that the ion beam travels in the implantation chamber before striking the implantation surface will be greater compared to a beam distance at a center of the workpiece implantation surface.

Obviously, the larger the workpiece and the greater the implantation angle is from zero (0) degrees, the greater the difference in the beam distance traversed by the ion beam within the implantation chamber as implantation moves from one end of the workpiece implantation surface to an opposite end of the implantation surface. As the ion beam tends to diffuse over its beam path, non-constant beam distance may have an adverse effect on achieving a uniform ion dosage implantation over an entirety of the workpiece implantation surface. Thus, the trend toward larger wafers exacerbates this non-constant beam distance problem.

To insure uniform implantation of a workpiece implantation surface, it would be desirable to maintain a substantially constant beam distance traversed by ion beam within the implantation chamber before striking the implantation surface of the workpiece. What is desired is a workpiece support structure that provides the capability of selecting a desired implantation angle and then maintaining a substantially constant beam distance between entry of the ion beam into the implantation chamber and impacting the implantation surface while the workpiece is moved with respect to the ion beam beam line during the implantation procedure.

SUMMARY OF THE INVENTION

One exemplary embodiment of the present invention concerns an ion beam implanter having a workpiece support structure for supporting a workpiece within a vacuum or implantation chamber. The ion beam implanter includes an ion beam source for generating an ion beam moving along a path of travel and being scanned along an axis. A workpiece is supported by the workpiece support structure in the implantation chamber such that the workpiece is positioned to intersect the path of travel of the scanned ion beam for implantation of a implantation surface of the workpiece by the ion beam. Advantageously, the workpiece support structure provides for: a) selecting a desired implantation angle; and b) moving the workpiece for implantation of the implantation surface by the ion beam while maintaining a substantially constant beam distance between entry of the ion beam into the implantation chamber and striking the implantation surface.

The workpiece support structure is coupled to the implantation chamber and supports the workpiece. The workpiece support structure includes a rotation member rotatably coupled to the implantation chamber, the rotation member having an axis of rotation perpendicular to a path of the ion beam within the implantation chamber wherein rotation of the rotation member with respect to the implantation chamber changing an implantation angle of the workpiece with respect to the path of the ion beam in the implantation chamber. The workpiece support structure further includes a translation member movably coupled to the rotation member and supporting the workpiece for linear movement along a path of travel in a direction transverse to the ion beam while maintaining the selected implantation angle. Preferably, the translation member is a linear motor disposed within the implantation chamber.

Advantageously, a distance between entry of the ion beam into the implantation chamber and an intersection of the ion beam and a surface of the workpiece remains substantially constant during movement of the workpiece along its path of travel.

These and other objects, advantages, and features of the exemplary embodiment of the invention are described in detail in conjunction with the accompanying drawings.

DETAILED DESCRIPTION

Figure 1:
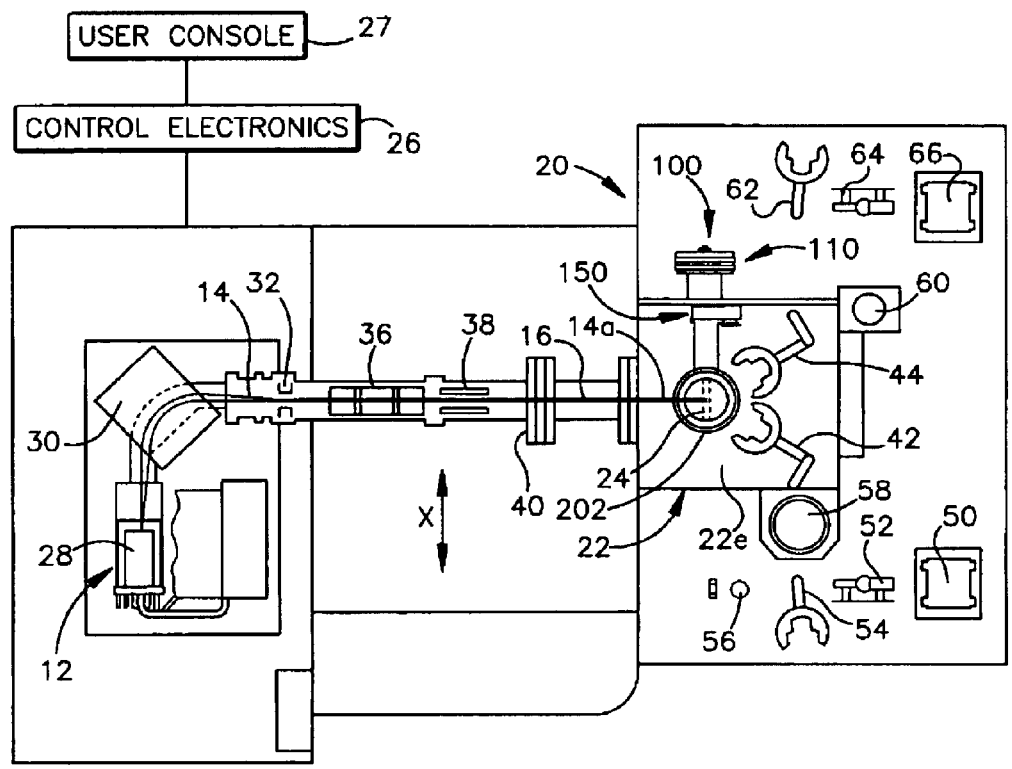
FIG. 1 is a schematic plan view of an ion beam implanter of the present invention.

Turning to the drawings, an ion beam implanter is shown generally at 10 in FIG. 1. The implanter includes an ion source 12 for creating ions that form an ion beam 14 which traverses a beam path 16 to an end or implantation station 20. The implantation station includes a vacuum or implantation chamber 22 defining an interior region 22e in which a workpiece 24 such as a semiconductor wafer or a flat panel or a substrate is positioned for implantation by the ion beam 16. Control electronics (shown schematically at 26) are provided for monitoring and controlling the ion dosage received by the workpiece 24. Operator input to the control electronics 26 are performed via a user control console 27.

The ion source 12 generates the ion beam 14 which impacts the workpiece 24. The ions in the ion beam 14 tend to diverge as the beam traverses a distance along the beam path 16 between the ion source 12 and the implantation chamber 22. The ion source 12 includes a plasma chamber 28 defining an interior region into which source materials are injected. The source materials may include an ionizable gas or vaporized source material.

Positioned along the beam path 16 is an analyzing magnet 30 which bends the ion beam 14 and directs it through a beam shutter 32. Subsequent to the beam shutter 32, the beam 14 passes through a quadrupole lens system 36 that focuses the beam 14. The beam path 16 extends through deflection electrodes 38 wherein the ion beam 14 is repetitively deflected or scanned to generate a ribbon ion beam such that a portion of the ion beam 14 within the implantation chamber 22 is a ribbon ion beam 14a. The ribbon ion beam 14a enters the implantation chamber 22 through an opening 22a in a front wall 22b of the chamber 22. The ribbon ion beam 14a is an ion beam that essentially has the shape of a very narrow rectangle that is, a beam that extends in one direction, e.g., has a horizontal or "x" direction extent (shown as W in FIG. 2) with very limited extent in the orthogonal direction, e.g., in the vertical or "y" direction.

Generally, the extent of the ribbon ion beam 14a is sufficient to implant the entire implantation surface 25 of the workpiece 24, that is, if the ribbon ion beam 14a traversing the implantation chamber 22 extends in the horizontal or x direction (FIG. 1) and the workpiece 24 has a horizontal dimension of 300 mm. (or a diameter of 300 mm.). The control electronics 26 will appropriately energize the electrode 38 such that a horizontal extent, W, of the ribbon ion beam 14a, upon striking the implantation surface 24 of the workpiece 24 within the implantation chamber 22, will be at least 300 mm. The electrode 38 deflects the beam 14 and a parallelizing lens 40 is positioned along the beam line 16 to correct for the beam angle deflection caused by the electrode 38 such that the ribbon ion beam 14a is parallel when it implants the workpiece 24.

As will be explained below, a workpiece support structure 100 both supports and moves the workpiece 24 with respect to the ribbon ion beam 14 during implantation such that the entire implantation surface 25 of the workpiece 24 is uniformly implanted with ions. In addition to the scanning technique described above, those of skill in the art will recognize that the ribbon shape of the ribbon ion beam 14a within the implantation chamber 22 can be created in a number of ways. For example, an arc slit of the plasma chamber 28 may be shaped such that the ion beam as created has a ribbon shape from inception. The present invention is not limited to the use of any particular technique or structure to shape or form the ion beam.

A more detailed description of an ion implanter adapted for serial implantation of workpieces is disclosed in U.S. Pat. No. 4,975,586, issued to Ray et al. on Dec. 4, 1990 and U.S. Pat. No. 4,761,559, issued to Myron on Aug. 2, 1988. The '586 and '599 patents are assigned to the assignee of the present invention and are incorporated herein in their respective entireties by reference.

The implantation chamber interior region 22e is evacuated. Two robotic arms 42, 44 mounted within the implantation chamber 22 automatically load and unload wafer workpieces to and from the workpiece support assembly or structure 100. The workpiece 24 is shown in a horizontal loading position in FIG. 1. Prior to implantation, the workpiece support structure 100 rotates the workpiece 24 to a vertical or near vertical position for implantation. If the workpiece 24 is vertical, that is, normal with respect to the ion beam 14, the implantation angle or angle of incidence is 0 degrees. It has been found that to minimize undesirable channeling effects, typically, a small but nonzero implantation angle is selected.

In a typical implantation operation, undoped workpieces are retrieved from a first cassette 50 by a shuttle 52 which brings a workpiece 24 to the vicinity of a robotic arm 54 which moves the workpiece to an orienter 56, where the workpiece 24 is rotated to a particular crystal orientation. The arm 54 retrieves the oriented workpiece 24 and moves it into a loading station 58 adjacent the implantation chamber 22. The loading station 58 closes, is pumped down to a desired vacuum, and then opens into the implantation chamber 22. The first arm 42 within the implantation station 22 grasps the workpiece 24, brings it within the implantation chamber 22 and places it on an electrostatic clamp or chuck 202 of the workpiece support structure 100. The electrostatic clamp 202 is energized to hold the workpiece 24 in place during implantation. Suitable electrostatic clamps are disclosed in U.S. Pat. No. 5,436,790, issued to Blake et al. on Jul. 25, 1995 and U.S. Pat. No. 5,444,597, issued to Blake et al. on Aug. 22, 1995, both of which are assigned to the assignee of the present invention. Both the '790 and '597 patents are incorporated herein in their respective entireties by reference.

After ion implantation of the workpiece 24, the workpiece support structure 100 returns the workpiece 24 to a horizontal position and the electrostatic clamp 102 is denergized to release the workpiece. The second arm 44 of the implantation station 22 grasps the implanted workpiece 24 and moves it from the implantation chamber 22 to an unload station 60. From the unload station 60, a robotic arm 62 moves the implanted workpiece 24 to a shuttle 64 which places the workpiece into a second cassette 66.

The workpiece support structure 100 is operated by the control electronics 26. The workpiece support structure 100 supports the workpiece 24 during implantation, and, advantageously, permits both rotational and translational movement of the workpiece 24 with respect to the ribbon ion beam 14a within the implantation chamber 22. By virtue of its rotational capability, the workpiece support structure 100 advantageously permits selection of a desired implantation angle or angle of incidence between the ion beam 14 and the implantation surface 25 of the workpiece 24.

By virtue of its translational or linear movement capability, the workpiece support structure 100 permits the implantation surface of the workpiece 24 to be moved along a plane coincident with the desired implantation angle during implantation thereby both maintaining the desired implantation angle and additionally keeping substantially constant a distance d (FIG. 2) that the ribbon ion beam 14a travels from its entry into the implantation chamber interior region 22e to the point (actually a line because the ion beam is a ribbon ion beam) where it impacts the implantation surface 25 of the workpiece 24. This substantially constant distance is maintained during the during entire implantation of the implantation surface 25. That is, the substantially constant distance is maintained as the workpiece 25 moves transversely with respect to the ribbon ion beam 14a, in a plane coincident with the desired implantation angle (IA) such that the entire implantation surface is implanted from one end 25a of the implantation surface 25 to the opposite end 25b (FIG. 2).

The maintenance of a substantially constant distance or path of travel for the ion beam 14a between the implantation chamber 22 and the impact of the ion beam 14a on the workpiece 24 is highly desirable for uniform ion implantation characteristics over the entire implantation surface 25 of the workpiece 24. Another way of looking at the workpiece support structure 100 is that it permits a substantially constant path of travel of the ion beam 14 from the ion source 12 to the point were it impacts the workpiece implantation surface 25.

As is customary in the industry, when the ion beam 14 is perpendicular to the implantation surface 25 of the workpiece 24, the implantation angle, IA, is defined as zero degrees. The position of the workpiece 24 with respect to the ribbon ion beam 14a shown in FIG. 2 has an implantation angle, IA, equal to 0 degrees, that is, the implantation surface 25 of the workpiece 24 is normal to the direction of the ion beam. To minimize detrimental channeling effects often times a non-zero implantation angle may be selected for implantation of the workpiece 24. Two non-zero implantation angles are shown schematically by the dashed lines in FIG. 2 labeled IA1 and IA2. If the workpiece 24 were oriented along implantation angle IA1, an upper portion of the workpiece 24 would be tilted away from the ion beam 14 and if the workpiece 24 were oriented along implantation angle IA2, a lower portion of the workpiece 24 would be tilted away from the ion beam 14.

During a production run, semiconductor wafer workpieces or flat panel workpieces are serially implanted. That is, when one workpiece's implantation is completed, the electrostatic clamp 202 is denergized to release the workpiece and implanted workpiece is automatically removed from the implantation chamber 22 and another workpiece is positioned on a support surface 204 of the electrostatic clamp 202 and the clamp is suitably energized to securely hold the workpiece 24 on the support surface 204.

Figure 2A:
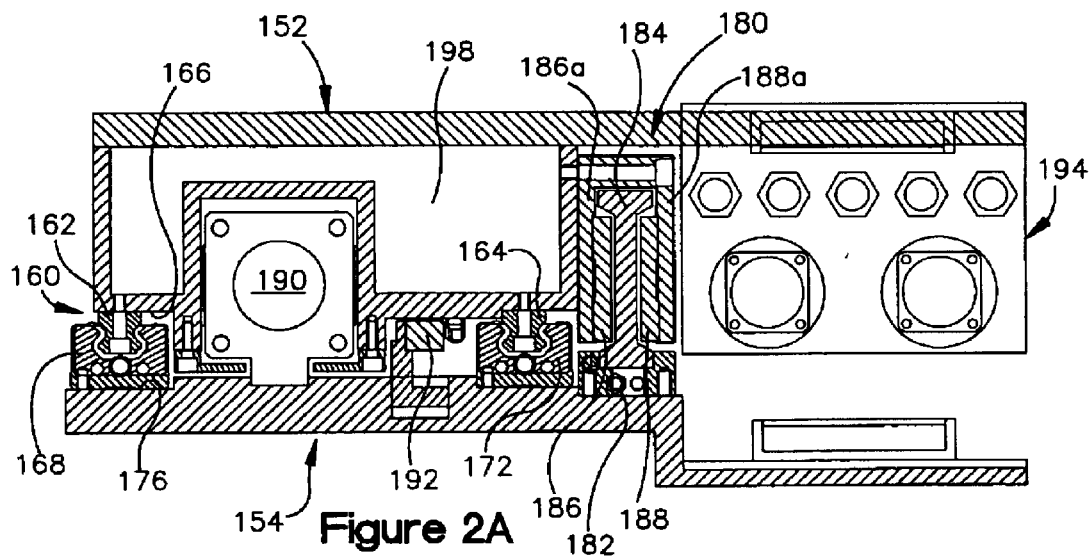
FIG. 2A is a schematic top sectional view of a portion of the workpiece support structure of FIG. 2 encircled with a dashed line and labeled FIG. 2A.
Figure 2:
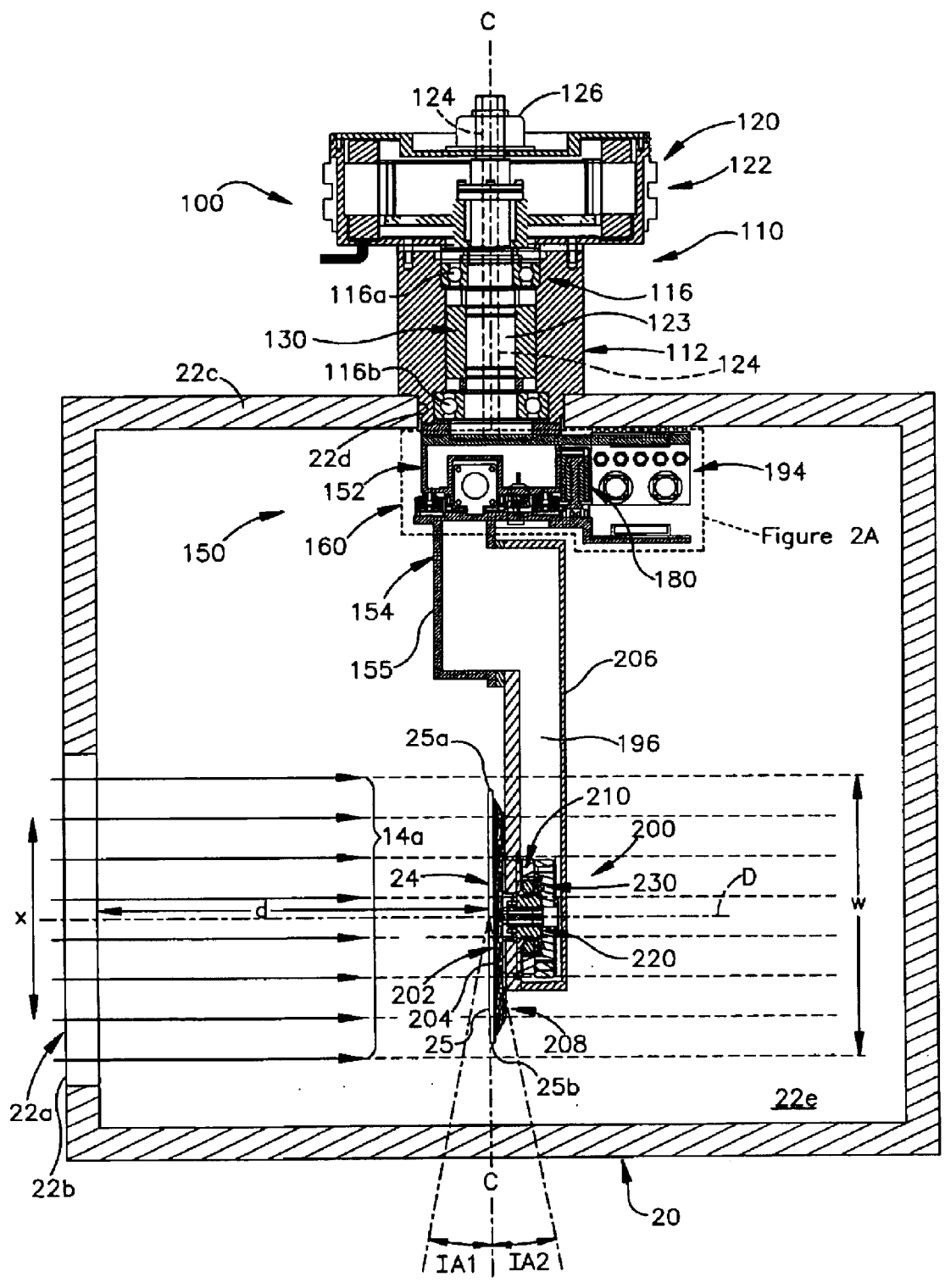
FIG. 2 is a schematic top sectional view of an implantation chamber and associated workpiece support structure of the ion beam implanter of FIG. 1 with the wafer support structure in wafer support position.
Figure 3:
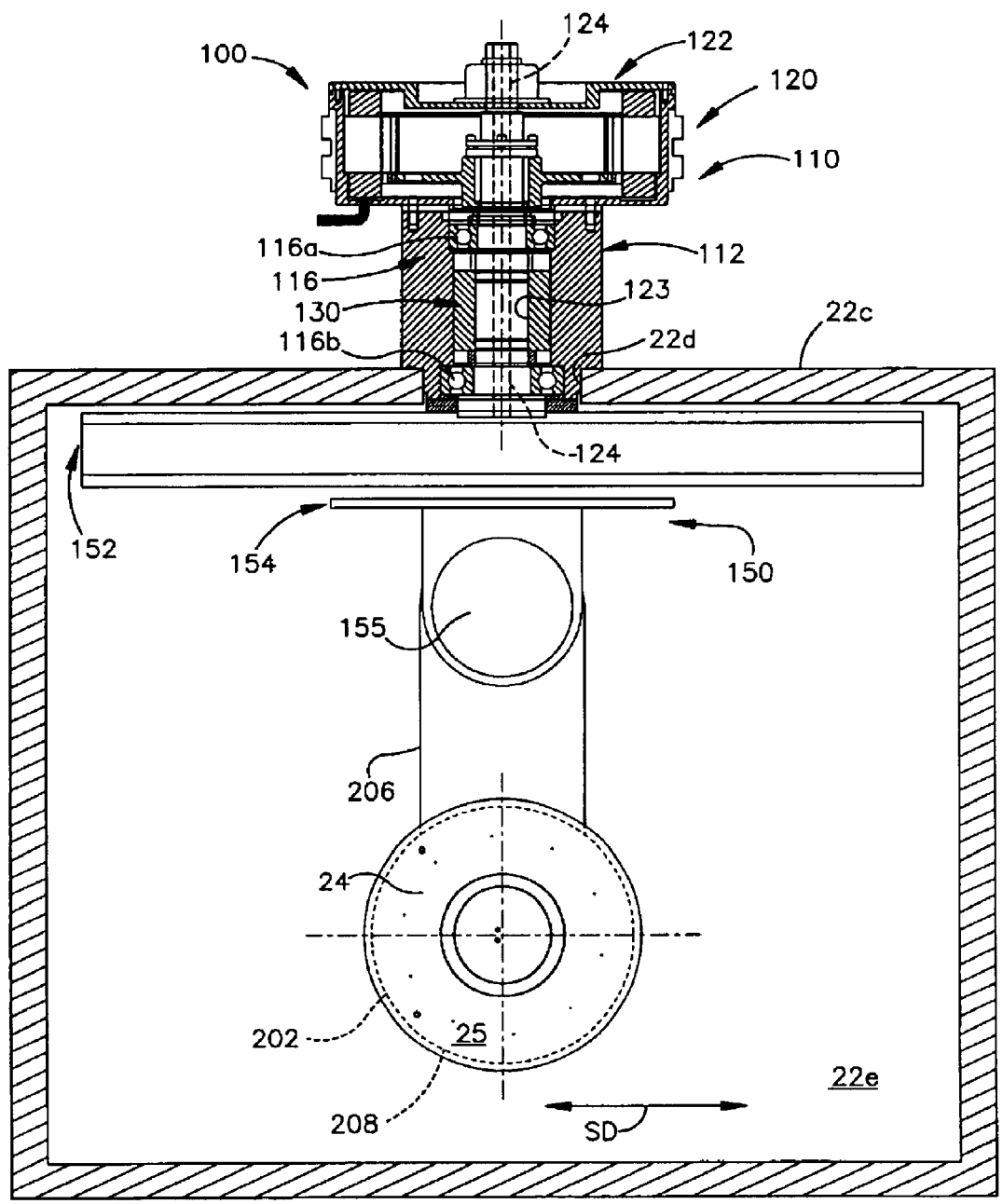
FIG. 3 is schematic front sectional view of the implantation chamber and workpiece support structure of FIG. 2 with the workpiece support structure in an implantation position.
Figure 4:
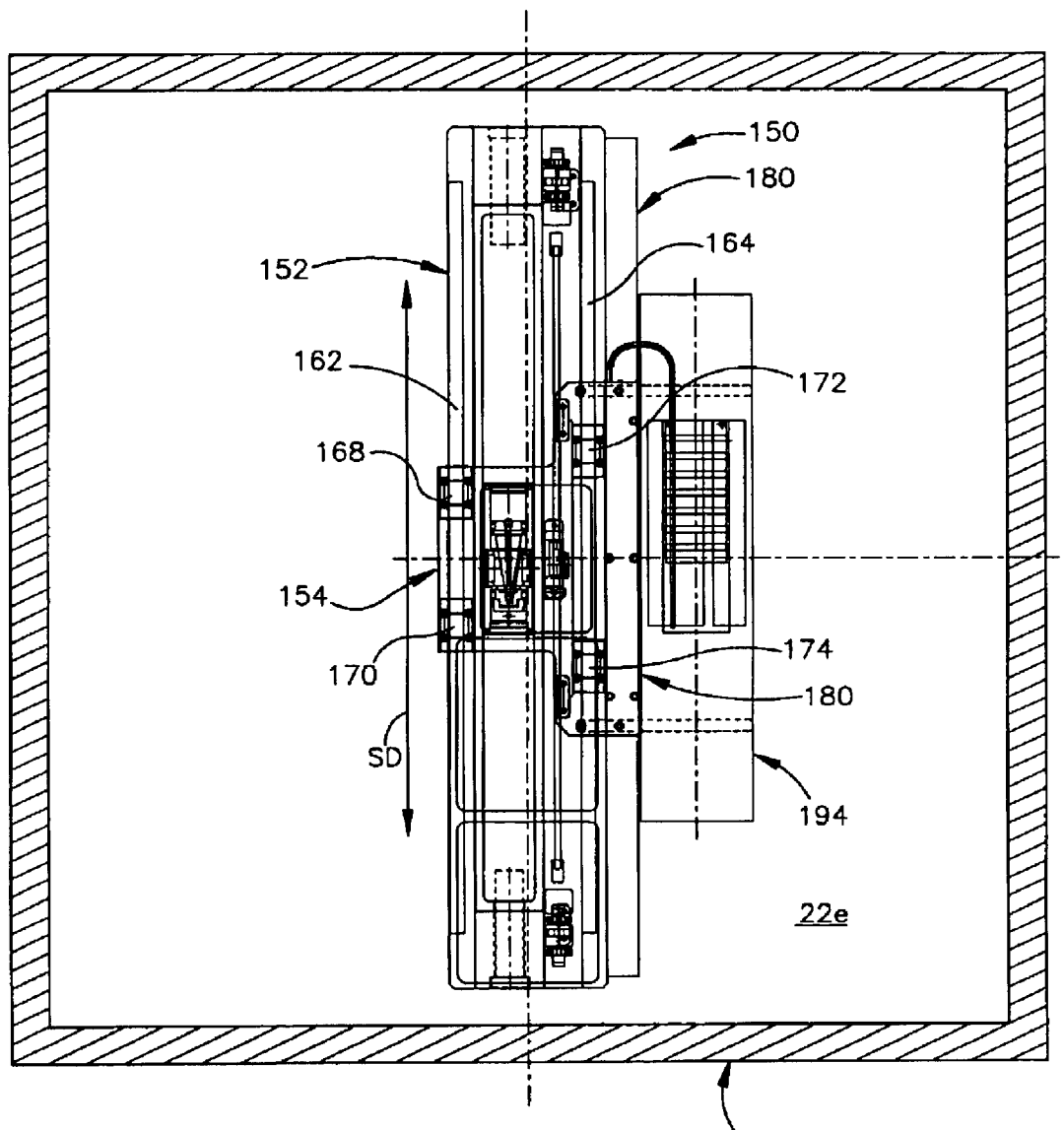
FIG. 4 is a schematic side elevation view a translation member of the workpiece support structure of FIG. 2 with the workpiece holder assembly removed.

The workpiece support structure 100 is best shown in FIGS. 2–4. FIG. 1 is a top plan view showing the electrostatic clamp 202 in the workpiece loading and unloading position. After a workpiece 24 is loaded on the support surface 204 of the electrostatic clamp 202, the workpiece support structure 100 rotates the workpiece to an implantation position, such as the position shown in FIG. 2 (IA=0 degrees). FIG. 2 is a top plan view showing the electrostatic clamp 202 supporting the workpiece 24 in an implantation position. FIG. 1 shows the workpiece 24 in the implantation position in dashed line.

During implantation of the workpiece 24, the workpiece support structure 100 moves the workpiece 24 in a direction transverse to the ribbon ion beam 14a such that the entire implantation surface 25 is appropriately impacted and implanted with desired ions. As can be seen in the schematic depiction in FIG. 2, the ribbon ion beam 14a at a point of impact with the workpiece 24 has a width W in the horizontal or "x" direction which is greater than the diameter of the workpiece 24, thus, no translation of the workpiece in the "x" direction is required for full implantation of the workpiece.

As can best be seen in FIGS. 2 and 3, the workpiece support structure 100 is affixed to a side wall 22c of the implantation chamber 22 and extending into the interior region 22e of the implantation chamber 22 through an opening 22d in the implantation chamber side wall 22c. The workpiece support structure 100 includes a rotation member 110 and an integral translation member 150. The workpiece support structure rotation member 110 comprises a rotary turntable assembly affixed to the implantation chamber 22. In one preferred embodiment, the rotation member 110 includes a spindle bearing support housing 112 affixed to the implantation chamber 22 and a rotary drive mechanism 120 rotatably affixed to the support housing 112. The support housing 112 is affixed to the implantation chamber 22 and, preferably, to the implantation chamber side wall 22c and extends into the opening 22d of the implantation chamber side wall 22c.

The rotary drive mechanism 120, in response to control signals from the control electronics 26, precisely rotates the workpiece 24 to a desired implantation angle (IA) between +/−89 degrees with respect to the ion beam 14. The centerline C—C (shown in dashed line in FIG. 2) of the rotation member 110 is aligned with the front of the workpiece implantation surface 25.

The rotation member 110 further includes a spindle bearing system 116 disposed in the spindle bearing support housing 112 and a hollow tilt axis shaft 123 rotatably supported by the spindle bearing systems. As can be seen in FIG. 2, the tilt axis shaft 123 extends into the implantation chamber interior region 22e. The rotation member 110 also includes a ferrofluidic rotary vacuum seal system 130 also disposed between spaced apart sets of bearings 116a, 116b of the spindle bearing system.

The rotary drive mechanism 120 includes a rotational servomotor 122 which, in response to control signals from the control electronics 26, precisely rotates the tilt axis shaft 123 and, thereby, rotates the workpiece 24 to the desired implantation angle (IA). The angular position of the shaft 123 is monitored and reported to the control electronics 26 by a tilt axis rotary encoder 126. The servo-motor 122 is of conventional design and may, for example, be a direct drive servomotor or a gear-reduced servomotor. A central opening or bore 124 extends through the tilt axis shaft 123 to permit facilities, such as electrical wiring, to be routed to the translation member 150. The central bore 124 is at atmospheric pressure, unlike the evacuated implantation chamber interior region 22e.

The tilt axis shaft 123 is rotatably supported within the support housing 112 by means of the bearing assembly 116. The bearing assembly includes the two spaced apart bearings 116a, 116b, each of which comprises a conventional mechanical bearing assembly such as ball or roller bearings supported within a bearing cage and disposed between and inner and outer races.

Alternately, the bearing assembly 116 may be a different type of bearing assembly such as, for example, a non-contact gas bearing assembly or other type of bearing assembly as would be recognized by one of skill in the art.

Vacuum is maintained between the interior region 22e of the implantation vacuum chamber and outside atmosphere (atmospheric pressure is present in the central bore 124 of the shaft 123 which extends into the implantation chamber interior region 22e) by means of magnetic fluid (ferrofluid) seal system 130. The magnetic fluid seal system 130 is cylindrically shaped and defines a throughbore or feedthrough through which the tilt axis shaft 123 extends. The magnetic fluid seal system 130 includes a housing supporting a ring-shaped permanent magnet, two ring-shaped pole pieces disposed on either side of the permanent magnet, and ferrofluid disposed in the respective radial gaps between the axial, inward facing surface of the pole pieces and the tilt axis shaft 123. The ferrofluid is a colloidal suspension of ultramicroscopic magnetic particles in a carrier liquid and is located in axial grooves machined into either the pole pieces or the shaft 123. For the magnetic fluid seal system 130 to properly work, the tilt axis shaft 123 must be magnetically permeable.

In the magnetic fluid seal system 130, a magnetic circuit is completed by the stationary pole pieces and the shaft 123. The magnetic circuit concentrates magnetic flux in the radial gap between each pole piece and the shaft 123. The ferrofluid in the respective radial gaps assumes the shape of a liquid O-ring and produces a hermetic seal between the ring-shaped pole pieces and the shaft 123. If necessary, multiple stages of ring-shaped permanent magnets and ring-shaped pole pieces may be used to increase the pressure capacity of the magnetic fluid seal system 130.

The ferrofluidic seal of the magnetic fluid seal system 130 provides a hermetic seal under both static and dynamic condiditons against gas, vapor and other contaminants. Further, since the sealing medium is a fluid, there is virtually no friction between the rotatable shaft 123 and the stationary portions of the seal system 130.

Suitable hollow shaft cartridge mount vacuum feedthroughs and hollow shaft flange mount vacuum feedthroughs for the magnetic fluid seal system 130 are commercially available from Ferrotec (USA) Corporation, 40 Simon Street, Nashua, N.H. 03060-3075 (web site: http://www.fero.com/usa/sealing). A magnetic fluid seal system is disclosed in U.S. Pat. No. 4,293,137, issued Oct. 6, 1981 to Ezekiel. The '137 patent is incorporated in its entirety herein by reference.

Alternately, a differentially pumped, contact-type vacuum seal system may be used to maintain the vacuum and is within the contemplated scope of the present invention. A description of a differentially pumped, contact-type vacuum-type vacuum seal systems is found in U.S. patent application Ser. No. 10/192,344 to Ferrara, filed on Jul. 10, 2002 and assigned to the assignee of the present invention. The '344 application is incorporated herein in its entirety by reference.

The workpiece support structure 100 further includes the translation or reciprocating member 150 which is integral with the rotation member 110 and is disposed with the implantation chamber interior region 22e. As can best be seen in FIGS. 2–4, the translation member 150 includes a support frame 152 affixed to the rotatable tilt axis shaft 123 and a carriage 154 mechanically coupled to the support frame 152 via a linear bearing assembly 160 for linear movement with respect to the support frame 152. The translation member 150 provides for linear translational movement of the workpiece 24 along a plane coincident with the selected implantation angle (IA).

As can best be seen in FIG. 2, the carriage 154 includes a flange 155 that supports the workpiece holder assembly 200. The workpiece holder assembly 200 includes a support arm 206, attached at one end to the flange 155 (FIG. 2) of the carriage 154. At its opposite end, the support arm 206 supports a workpiece holder 208 of the workpiece holder assembly 200. The workpiece holder 208 supports the electrostatic clamp 202 which, in turn, supports the workpiece 24 for movement in front of the ribbon ion beam 14a.

The carriage 154 is supported for linear movement with respect to the support frame 152 by means of the linear bearing assembly 160. The bearing assembly 160 (best seen in FIGS. 2A and 4) preferably includes a pair of spaced apart, parallel linear rail supports 162, 164 affixed to an outward face 166 of the stationary support 152 and four bearing ways 168, 170, 172, 174 (FIG. 4) affixed to an inward face 176 of the carriage 154. A plurality of ball or roller bearings are disposed in each of the four bearing ways 168, 170, 172, 174. The bearings of the two spaced apart ways 168, 170 bear against and roll along the rail support 162 and the bearings of the two spaced apart ways 172, 174 bear against and roll along the rail support 164 to provide for linear movement of the carriage 154 with respect to the stationary support 152 and the implantation chamber 22.

Alternately, the bearing assembly 160 may be a different type of conventional linear bearing assembly such as ball or roller bearings supported within a bearing cage and disposed between inner and outer races as would be recognized by one of ordinary skill in the art. Additionally, the bearing assembly 160 may be a non-contact gas bearing assembly could be suitably employed as would be recognized by one of ordinary skill in the art. A non-contact gas bearing assembly is disclosed in the '344 application previously referenced. All of these types of bearing assemblies are with the contemplated scope of the present invention.

Linear motion of the carriage 154 with respect to the support frame 152, the vertical or "y" direction which is labeled "SD" for "scan direction" in FIGS. 3 and 4, is achieved by a linear motor assembly including a linear servomotor 180 disposed between an inwardly facing stepped portion 182 of the carriage 154 and the support frame 152. Preferably, the linear brushless servomotor 180 comprises a non-magnetic forcer coil to provide zero clogging for smooth velocity control and excellent positional accuracy. Alternatively, the liner servomotor may be of an iron-core brushless type, but this type of servomotor inherently has velocity control that is less smooth and positional accuracy that is less accurate than the non-magnetic type.

As can best be seen in FIGS. 2A and 4, the servomotor 180 includes an elongated electromagnetic motor coil 184 and two parallel sets of permanent magnets 186, 188 disposed on respective magnet tracks 186a, 188a located on either side of the electromagnetic coil 184. The magnet tracks 186a, 188a are supported by the support frame 152. The electromagnetic coil 184 is appropriately energized by the control electronics 26 to precisely control the linear movement of the carriage 154 with respect to the support frame 152.

The translation member 150 further includes a linear brake assembly 190 and a vacuum compatible linear readback encoder 192 both affixed to the inward facing surface 176 of the carriage 154 to facilitate precise control of the position of the carriage 154 and thereby position of the workpiece 24 with respect to the ion beam 14a. The linear brake assembly 190 comprises a movable piston assembly that can be acutated pneumatically or by means of a solenoid so that the piston contacts the support frame 152, thereby providing a means of holding the carriage 154 in a fixed position.

Since the linear motor assembly 180 can potentially be oriented so that the path of travel of the carriage 154 is not always normal relative to the gravitational acceleration direction, one purpose of the linear brake assembly 190 is to act as a fail-safe mechanism so that if the linear motor 180 is de-energized, the brake assembly 190 will be energized so that the carriage 154 will remain in its current desired position and not be accelerated to the lowest point of along its path of travel. The design of the linear brake assembly 190 may be of any conventional type that prevents motion of the carriage 154 when the linear motor 180 is de-energized so that the action is fail-safe, i.e., prevents motion of the carriage 154 during loss of power.

The translation member 150 further includes a linear motion harness system 194. One end of the harness system 194 is attached to and moves with the carriage 154 and the other end of the harness system is stationary and attached to the support frame 152. The harness system 194 provides support for electrical and cooling lines such as linear motor power lines, linear motion commutation information lines, water cooling lines, brake control lines (pneumatic or electrical), encoder readback signal information lines, electrostatic clamp control lines, workpiece rotate motor power and control signal lines and workpiece support arm pressure communication so that an interior area 196 of the workpiece support arm 206 may be maintained at atmospheric pressure.

The water cooling lines of the harness system 194 provide cooling for the workpiece 24 located at the electrostatic chuck 202 and the electromagnetic coil 184 of the linear servomotor 180. Advantageously, since the interior region 196 of the support arm 206 is at atmospheric pressure, a direct drive motor 210 of the workpiece holder assembly 200 which rotates the electrostatic clamp 202 and the workpiece 24 disposed thereon for quad or octal implants, the direct drive motor does not require cooling water Additionally, since the drive motor 210 is at atmospheric pressure, a strandard brushless type servomotor and a standard encoder may be used.

At the end of the harness system 194 affixed to the support frame 152, the electrical and cooling lines of the harness system 194 pass through vacuum feedthroughs to an interior region 198 (FIG. 2A) of the support frame 152 that is at atmospheric pressure and subsequently through the central bore 124 (shown in dashed line in FIGS. 2 and 3) of the tilt axis shaft 123. The moving end of the harness system connects to the carriage 154 and the linear motor 180. The harness system connections that communicate to the electrostatic clamp 202, the direct drive motor 210, and the linear brake assembly 190 pass through vacuum feedthroughs to the interior region 196 of the workpiece support arm 206.

The reciprocating linear motion of the carriage 154 during implantation is perpendicular to a normal vector of the workpiece implantation surface 25. Stated another way, linear movement of the carriage 154 causes movement of the workpiece 24 within a plane coincident with the selected implantation angle (IA). Multiple independent degrees of freedom or motion are advantageously achieved by combination of the reciprocating linear motion of the translation member 150 with respect to the rotational member 110. This allows for constant focal length scanning of the workpiece 24 in front of the ion beam 14. In other words, a distance from the impact point of the ion beam on the workpiece implantation surface 25 to the ion beam 14 entrance into the implantation chamber 22 is always constant for all rotation angles of the rotational member 110, that is, all implantation angles (IA).

The workpiece 24 is held on the workpiece holder assembly 200 by means of the electrostatic clamp or chuck 202. The electrostatic chuck 202 is cooled in order to remove the energy or heat that is transferred from the workpiece 24 during implantation. In order to allow for quad or octal implants, preferably, the workpiece holder 208 and the electrostatic clamp 202 coupled thereto rotate with respect to the support arm 206. The workpiece holder 208 is operatively coupled to the direct drive motor 210 so that the workpiece holder 208 and the workpiece support surface 204 of the clamp 202 can rotate up to 360 degrees. The rotational centerline of the electrostatic clamp 202, shown as dashed line D in FIG. 2, is aligned with a centerline of the workpiece 24. Alternately, the drive motor 210 may rotate the workpiece holder 208 indirectly by a belt or cable.

The workpiece holder 208 is mounted to the support arm 206 by means of a bearing assembly 220. The bearing assembly 220 is preferably a ball or roller bearing assembly, having ball or roller bearings supported within a bearing cage and disposed between and arcuate inner and outer races affixed to or formed in the corresponding surfaces of the workpiece holder 208 and the support arm 206. Alternately, the bearing assembly 220 may be a non-contact gas bearing.

In one preferred embodiment, the drive motor 210 includes an integral rotary vacuum seal system 230 between the support arm 206 and workpiece holder 208. The vacuum seal system 230 is needed because, as noted previously, the interior region 196 (FIG. 2) of the workpiece support assembly support arm 206 is at atmospheric pressure. Preferably, the vacuum seal system 230 is a magnetic fluid (ferrofluid) seal system, similar to the seal system 130 discussed above. Alternatively, a differentially pumped radial vacuum seal system may be used as the seal system 230. Both of these seal system designs as well as other seal systems such as a lip seal or other polymer material contact-type seal designs as well as non-contact vacuum seal systems know to those of skill in the art would also be suitable for the vacuum seal system 230 and are within the contemplated scope of the present invention.

While the present invention has been described with a degree of particularity, it is the intent that the invention include all modifications and alterations from the disclosed design falling with the spirit or scope of the appended claims.

I claim:

1. An ion beam implanter comprising:
   a) an ion beam source for generating an ion beam moving along a beam line;
   b) an implantation chamber stationary with respect to a portion of the the ion beam beam line within the implantation chamber wherein a workpiece is positioned to intersect the ion beam for ion implantation of an implantation surface of the workpiece by the ion beam; and
   c) workpiece support structure coupled to the implantation chamber and supporting the workpiece, the workpiece support structure including:
      1) a rotation member coupled to and rotating with respect to the implantation chamber for changing an implantation angle of the workpiece with respect to a portion of the ion beam within the implantation chamber; and
      2) a translation member disposed within the implantation chamber and movably coupled to the rotation member, the translation member supporting the workpiece for movement along a linear path of travel.

2. The ion beam implanter of claim 1 wherein movement of the translation member maintains a constant distance that the ion beam moves through the implantation chamber before striking the implantation surface of the workpiece.

3. The ion beam implanter of claim 1 wherein the rotation member has an axis of rotation perpendicular to the portion of the ion beam within the implantation chamber.

4. The ion beam implanter of claim 1 wherein movement of the translation member is perpendicular to an axis of rotation of the rotation member and parallel to the implantation surface of the workpiece.

5. The ion beam implanter of claim 1 wherein the translation member includes a support frame affixed to the rotation member, a carriage movable with respect to the support frame along a linear path of travel and a linear motor driving the carriage along its path of travel.

6. The ion beam implanter of claim 5 wherein the translation member further includes a workpiece holder assembly extending inside the implantation chamber and comprising an electrostatic clamp for holding the workpiece.

7. The ion beam implanter of claim 6 wherein the electrostatic clamp is rotatable with respect to the ion beam.

8. The ion beam implanter of claim 1 wherein a vacuum is maintained between the implantation chamber and the rotation member by a circular vacuum seal.

9. The ion beam implanter of claim 8 wherein the circular vacuum seal is a ferrofluidic vacuum seal.

10. The ion beam implanter of claim 1 wherein the translation member includes a support frame affixed to the rotation member, a carriage movable with respect to the support frame along a linear path of travel and a linear bearing between the support frame and the carriage.

11. An ion beam implanter comprising:
    a) an ion beam source for generating an ion beam moving along a beam line;
    b) an implantation chamber fixed with respect to a portion of the ion beam beam line within the implantation chamber wherein a workpiece is positioned to intersect the ion beam for ion implantation of a surface of the workpiece by the ion beam; and
    c) workpiece support structure coupled to the implantation chamber and supporting the workpiece, the workpiece support structure including:
      1) a rotation member coupled to and rotating with respect to the implantation chamber for changing an implantation angle of the workpiece with respect to a portion of the ion beam within the implantation chamber; and
      2) a translation member disposed within the implantation chamber and movably coupled to the rotation member, the translation member supporting the workpiece for linear movement along a path of travel wherein movement of the translation member is parallel to the implantation surface of the workpiece.

12. The ion beam implanter of claim 11 wherein a distance between a position where the ion beam enters the implantation chamber and an intersection of the ion beam and a surface of the workpiece remains constant during movement of the workpiece along its path of travel.

13. The ion beam implanter of claim 11 wherein the rotation member has an axis of rotation perpendicular to the portion of the ion beam within the implantation chamber.

14. The ion beam implanter of claim 11 wherein the translation member includes a linear servo motor disposed between a support frame affixed to the rotation member and a movable carriage supporting the workpiece.

15. The ion beam implanter of claim 11 wherein movement of the translation member is perpendicular to the axis of rotation of the rotation member.

16. The ion beam implanter of claim 11 wherein the translation member includes a translation shaft mounted inside the rotation member and having a direction of movement that intersects the axis of rotation of the rotation member.

17. The ion beam implanter of claim 16 wherein the translation member further includes a workpiece holder assembly extending inside the implantation chamber and comprising an electrostatic clamp for holding the workpiece.

18. The ion beam implanter of claim 16 wherein the electrostatic clamp is rotatable with respect to the ion beam.

19. The ion beam implanter of claim 11 wherein a vacuum is maintained between the implantation chamber and the rotation member by a circular vacuum seal.

20. The ion beam implanter of claim 19 wherein the circular vacuum seal is a ferrofluidic vacuum seal.

21. The ion beam implanter of claim 11 wherein the translation member includes a support frame affixed to the rotation member, a carriage movable with respect to the support frame along a linear path of travel and a linear bearing between the support frame and the carriage.

22. A workpiece support assembly for an ion beam implanter generating an ion beam moving along a beam line and including an implantation chamber stationary with respect to a portion of the ion beam beam line within the implantation chamber wherein a workpiece is positioned to intersect the ion beam for ion implantation of an implantation surface of the workpiece by the ion beam, the workpiece support assembly comprising:
    a) a rotation member coupled to and rotating with respect to the implantation chamber for changing an implantation angle of the workpiece with respect to a portion of the ion beam within the implantation chamber; and
    b) a translation member disposed within the implantation chamber and movably coupled to the rotation member, the translation member supporting the workpiece for movement along a linear path of travel.

23. The workpiece support assembly of claim 22 wherein movement of the translation member maintains a constant distance that the ion beam moves through the implantation chamber before striking the implantation surface of the workpiece.

24. The workpiece support assembly of claim 22 wherein the rotation member has an axis of rotation perpendicular to the portion of the ion beam within the implantation chamber.

25. The workpiece support assembly of claim 22 wherein movement of the translation member is perpendicular to an axis of rotation of the rotation member and parallel to the implantation surface of the workpiece.

26. The workpiece support assembly of claim 22 wherein the translation member includes a linear servo motor disposed between a support frame affixed to the rotation member and a movable carriage supporting the workpiece.

27. The workpiece support assembly of claim 26 wherein the translation member further includes a workpiece holder extending inside the implantation chamber and comprising an electrostatic clamp for holding the workpiece.

28. The workpiece support assembly of claim 27 wherein the electrostatic clamp is rotatable.

29. The workpiece support assembly of claim 22 wherein a vacuum is maintained between the implantation chamber and the rotation member by a circular vacuum seal.

30. The workpiece support assembly of claim 29 wherein the circular vacuum seal is a ferrofluidic vacuum seal.

31. The workpiece support assembly of claim 22 wherein the translation member includes a support frame affixed to the rotation member, a carriage movable with respect to the support frame along a linear path of travel and a linear bearing between the support frame and the carriage.

32. A method of implanting ions in a workpiece using an ion beam implanter generating an ion beam for implanting a workpiece and having an implantation chamber fixed with respect to a portion of a beam line of the ion beam within the implantation chamber wherein a workpiece is positioned to intersect the ion beam for ion implantation of an implantation surface of the workpiece, the steps of the method comprising:

a) providing a workpiece support structure coupled to the implantation chamber and supporting the workpiece, the workpiece support structure including:
  1) a rotation member coupled to and rotating with respect to the implantation chamber for changing an implantation angle of the workpiece with respect to a portion of the beam line of the ion beam within the implantation chamber; and
  2) a translation member disposed within the implantation chamber and movably coupled to the rotation member and supporting the workpiece for movement along a path of travel;

b) positioning the workpiece on the translation member;

c) selecting a desired implantation angle for the workpiece by rotating the rotation member;

d) directing the ion beam at the workpiece; and e) moving the workpiece along a linear path of travel by moving the translation member.

33. The method of implanting ions in a workpiece of claim 32 wherein movement of the translation member maintains a constant distance that the ion beam moves through the implantation chamber before striking the implantation surface of the workpiece the workpiece.

34. The method of implanting ions in a workpiece of claim 32 wherein the ion beam is a ribbon ion beam when striking the workpiece and the workpiece path of travel is transverse to an extent of the ribbon ion beam and the portion of the ion beam beam path within the implantation chamber.

* * * * *